United States Patent [19]
Tews et al.

[11] Patent Number: 6,159,874
[45] Date of Patent: Dec. 12, 2000

[54] METHOD OF FORMING A HEMISPHERICAL GRAINED CAPACITOR

[75] Inventors: Helmut Horst Tews, Poughkeepsie; Brian Lee, New York, both of N.Y.

[73] Assignee: Infineon Technologies North America Corp., San Jose, Calif.

[21] Appl. No.: 09/427,991

[22] Filed: Oct. 27, 1999

[51] Int. Cl.[7] .................... H01L 21/8242; H01L 21/20
[52] U.S. Cl. .................... 438/964; 438/253; 438/255; 438/396; 438/398; 438/243; 438/386; 438/389; 438/246
[58] Field of Search .................... 438/964, 253, 438/255, 396, 398, 243, 386, 389, 246

[56] References Cited

U.S. PATENT DOCUMENTS 5,856,007   1/1999   Sharan et al. .................... 438/398

OTHER PUBLICATIONS

Wolf et al., "Silicon Processing for the VLSI Era, vol. 1—Process Technology." Lattice Press, 1986, pp (297–303).

*Primary Examiner*—John F. Niebling
*Assistant Examiner*—Jennifer M. Kennedy
*Attorney, Agent, or Firm*—Stanton Braden

[57] ABSTRACT

A method of manufacturing a capacitor is provided where at least a portion of a silicon surface is amorphized. The amorphized silicon surface is then subjected to an annealing process to form hemispherical silicon grains (HSG) from the amorphized portion of the silicon surface to form at least a portion of a first electrode of the capacitor. A capacitor dielectric is then formed over the hemispherical silicon grains. A second electrode is then formed over the capacitor dielectric.

21 Claims, 10 Drawing Sheets

METHOD OF FORMING A HEMISPHERICAL GRAINED CAPACITOR

BACKGROUND

This invention relates generally to integrated circuits and, more particularly, to methods for forming capacitors in integrated circuits.

Dynamic random access memory (DRAM) cell is a type of integrated circuits which uses a capacitor. A DRAM cell's capacitor stores a charge which represents data, that is, a logic 1 or logic 0 condition. A DRAM cell also includes a transistor for accessing the capacitor to charge or discharge the capacitor (i.e., "write" new information to the DRAM cell), to determine whether a charge is stored in the capacitor or not (i.e., "read" the information stored in the DRAM cell), or to refresh a charge stored in the capacitor.

DRAM cells are typically organized into arrays of DRAM cells. With the continual increase in integration density of integrated circuits, space available for each DRAM cell in an array is continually reduced. Such reduction can affect the performance of the DRAM cell. For example, the capacitance of a DRAM cell's capacitor may be reduced as the integration density is increased, reducing the data retention time of the cell.

Figure 1:
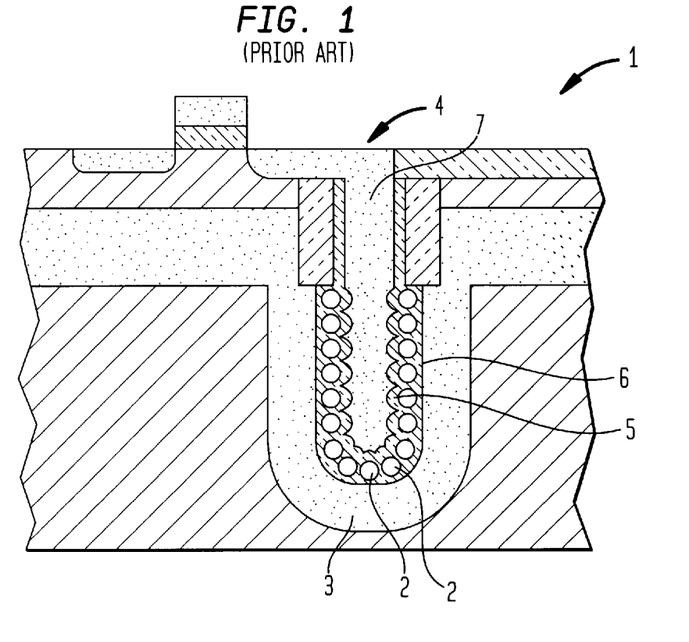
FIG. 1 is a cross-sectional diagrammatical sketch of a prior art trench capacitor DRAM cell.

Various methods exist for increasing the capacitance of a DRAM cell's capacitor. Some of these methods entail increasing the surface area of the electrodes of the DRAM cell's capacitor. Referring to FIG. 1, one technique for increasing the surface area of the electrodes involves forming hemispherical silicon grains (HSG) 2 over an electrode 3 of a trench capacitor 4 of a DRAM cell 1. To form the hemispherical silicon grains (HSG), an amorphous silicon layer is deposited over electrode 3. This amorphous silicon layer is then subjected to a two-step anneal process. In the first step, the amorphous silicon layer is annealed in a silane ($SiH_4$) environment to form small silicon crystal structures on the layer. In the second step, the amorphous silicon layer is annealed in a vacuum to re-crystallize the silicon in the amorphous silicon layer around the small crystal structures to form hemispherical silicon grains (HSG) 2. Preferably, the second step is continued until the entire amorphous silicon layer is re-crystallized. Note that if the amorphous silicon layer is doped, HSG particles are also doped. If the amorphous silicon layer is not doped, then the HSG particles are not doped and should be doped. In that case, the HSG particles can be doped by ex-situ doping by conventional gas plasma doping or plasma doping techniques. The HSG particles can also be doped by out diffusion from another layer, such as from a buried plate.

After forming the hemispherical silicon grains (HSG) 2, a dielectric layer 5 is deposited over the grains. Dielectric layer 5 substantially conforms to the shape of the grains and therefore has an uneven surface. The surface area of the uneven surface of dielectric layer 5 can be two to three times greater than that which would have resulted from depositing dielectric layer 5 over the smooth silicon surface of trench walls 6 of trench capacitor 4. A second electrode 7 is then formed over dielectric layer 5 by filling the trench with doped poly-crystalline silicon. Because of the unevenness of dielectric layer 5, electrode 7 also has an increased electrode surface area. The structure is then processed in a conventional manner to form DRAM cell 1.

SUMMARY

In one general aspect, the invention features a method of manufacturing a capacitor. A silicon surface is provided and at least a portion of the silicon surface is amorphized. The amorphized silicon surface is then subjected to an annealing process to form hemispherical silicon grains (HSG) from the amorphized portion of the silicon surface to form at least a portion of a first electrode of the capacitor. A capacitor dielectric is then formed over the hemispherical silicon grains. A second electrode is then formed over the capacitor dielectric.

Hence, instead of depositing an amorphous silicon layer for forming hemispherical silicon grains (HSG), a silicon surface (such as walls of a trench or a deposited poly-crystalline silicon layer) is amorphized. Using this technique, it is possible to form a relatively thin amorphous silicon layer to be used in forming hemispherical silicon grains (HSG) for capacitors.

Preferred embodiments of the invention may include one or more of the following features.

To provide the silicon surface, a silicon substrate is provided and a trench is formed in the substrate. The trench is defined by at least one wall, where at least a portion of that wall comprises the silicon surface. A mask is deposited on a lower portion of the wall, and an insulation collar is formed on the upper portion of the wall. The mask is removed to expose the lower portion of the trench. The lower portion of the wall is the amorphized by, for example, subjecting the silicon surface to an ion implantation process. The ion implantation process can be a conformal ion implantation process such as a plasma immersion ion implantation (PIII) process or a plasma doping (PLAD) process.

The ions used in the ion implantation process can be substantially silicon ions, ions of an inert element (e.g. Xenon or Argon), or ions of a dopant species (e.g. Arsenic or Phosphorous). When a non-dopant species is used for amorphizing the silicon surface, a dopant species can be implanted through the hemispherical silicon grains into portions of the silicon substrate surrounding the lower portion of the trench.

The silicon surface is heated to diffuse and activate the dopant. The steps of annealing and heating can be performed in situ. The silicon surface can be annealed in silane ($SiH_4$) in order to form hemispherical silicon grains (HSG).

The silicon surface can be provided by depositing a poly-crystalline silicon layer over a substrate, a portion of the poly-crystalline silicon layer comprising the silicon surface.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will become apparent from the following description of preferred embodiments, including the drawings, and from the claims.

DESCRIPTION

Figure 2A:
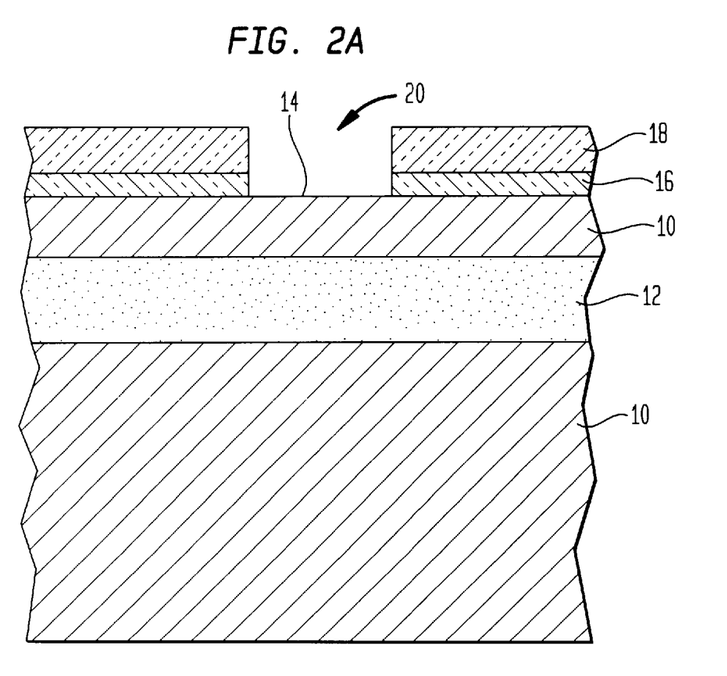
FIGS. 2A–2I are cross-sectional diagrammatical sketches of a trench capacitor DRAM cell at various stages in the fabrication thereof.

FIG. 2A shows a single crystal semiconductor body, here a silicon substrate 10. Substrate 10 has a buried plate implanted layer 12, here a phosphorus doped layer formed in substrate 10 at a selected depth of about 1.5 microns from an upper surface 14 of substrate 10. Note that in some embodiments buried plate 12 is formed at a later stage in the process. The doping concentration of buried layer 12 here has a dosage of about $10^{12}$–$10^{14}$ per cm$^2$. A dielectric layer 16 of silicon dioxide, here about 100 Angstroms thick, is thermally grown over upper surface 14 of silicon substrate 10. A pad layer 18, here a 1000–2000 Angstroms thick layer of silicon nitride, is disposed on the upper surface of dielectric layer 16.

Figure 2B:
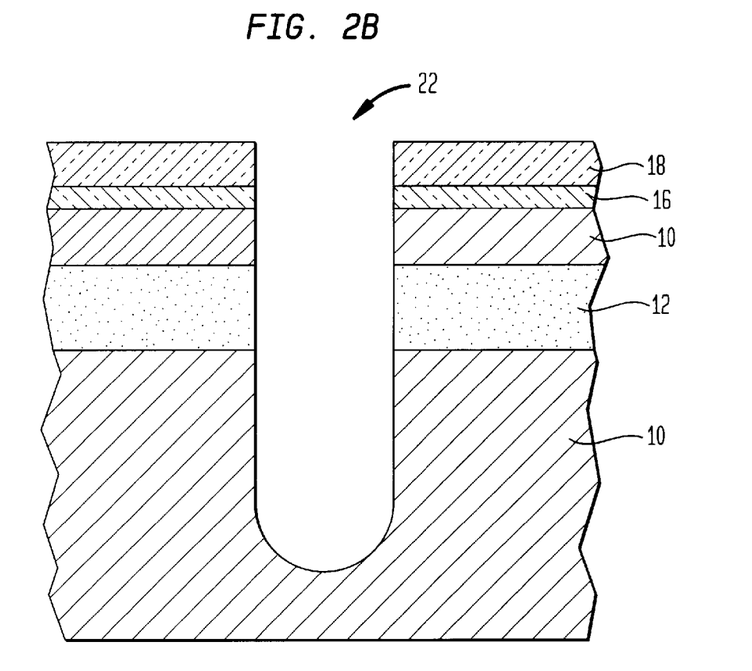

A window 20 is then formed in pad layer 18 and dielectric layer 16 using conventional photolithographic (e.g., hard TEOS or BSG mask, not shown) chemical etching (e.g., reactive ion etching, R.I.E.) techniques. Referring to FIG. 2B, the windowed pad layer 18 and hard mask are used as a mask to etch a trench 22 into a portion of silicon substrate 10 using conventional etching techniques. Here, the depth of trench 22 is in the order of 3–10 microns from upper surface 14 of silicon substrate 10, and the width of trench 22 is in the order of 0.10–0.25 microns.

Figure 2C:
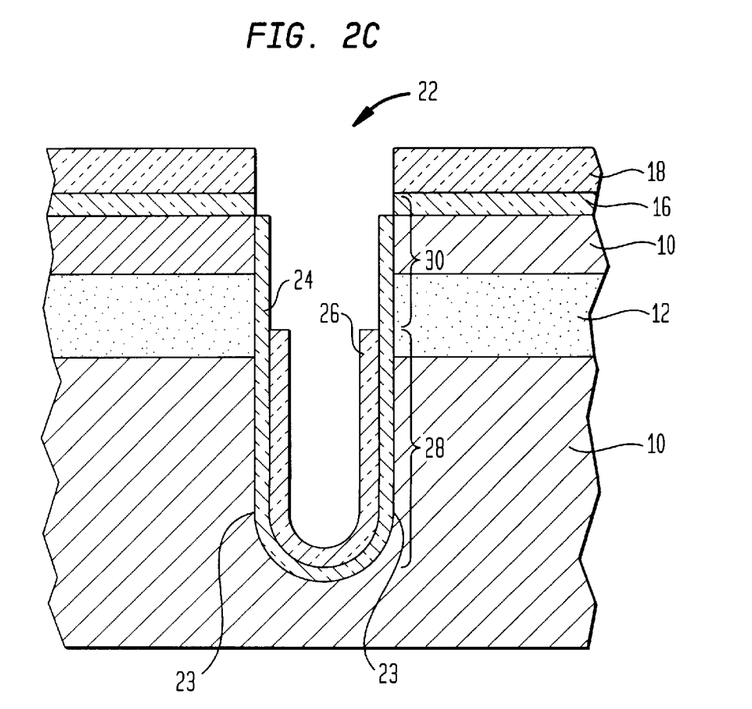

Referring to FIG. 2C, a thin silicon dioxide layer 24 is next grown on walls 23 of trench 22 to passivate and protect walls 23. Here, silicon dioxide layer 24 is in the order of 20–50 Angstroms thick. Next, a silicon nitride layer 26 is deposited over silicon dioxide layer 24, and etched using conventional photolithographic chemical etching techniques such that silicon nitride layer 26 covers only a lower portion 28 of trench 22. An upper portion 30 of trench 22 remains uncovered by silicon nitride layer 26. Here, silicon nitride layer 26 is in the order of 50–100 Angstroms thick.

Figure 2D:
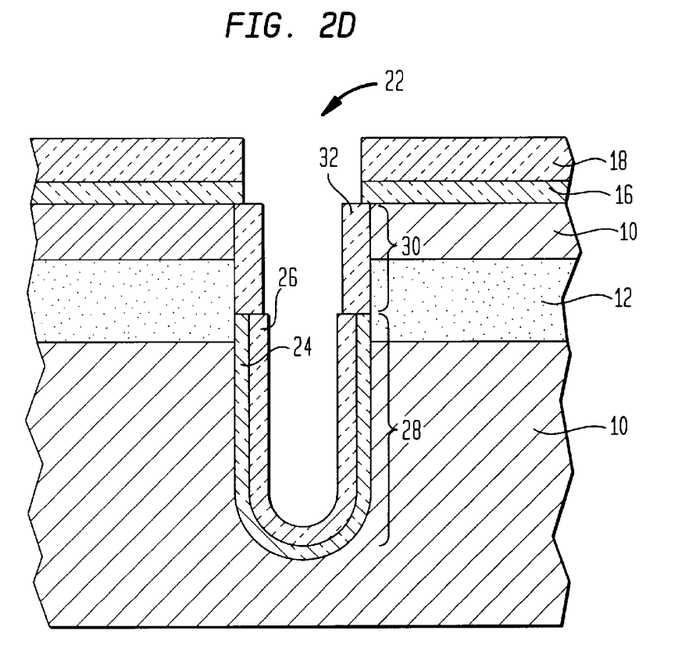

Referring to FIG. 2D, a localized oxidation of silicon (LOCOS) collar 32 is next formed in upper portion 30 of trench 22 by a conventional LOCOS process, here thermal oxidation of silicon substrate 10 surrounding upper portion 30 of trench 22.

Figure 2E:
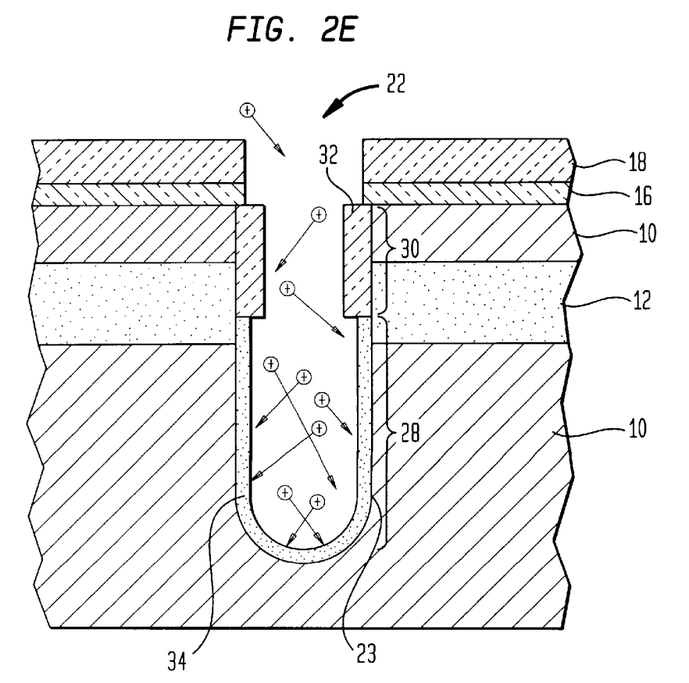

Referring to FIG. 2E, silicon nitride layer 26 and silicon dioxide layer 24 are next removed from lower portion 28 of trench 22 using conventional etching processes, here wet chemical etching. The entire structure is then subjected to a conformal ion implantation process to amorphize side and bottom walls 23 of lower portion 28 of trench 22. Here, the structure is placed in a plasma chamber for ion implantation by a plasma immersion ion implantation (PIII) process, although other conformal ion implantation processes such as a plasma doping (PLAD) process can also be used.

During the PIII process, substrate 10 is intermittently negatively biased by a pulsed voltage and exposed to a high dose, low energy plasma, here at dosage of approximately $5e^{14}$–$1e^{16}$ cm$^{-2}$ and at 5 kV–10 kV bias voltage. The negative bias of substrate 10 causes ions of the plasma to travel into trench 22 and conformally strike exposed surfaces of side and bottom walls 23 in lower portion 28 of trench 22. These ions in the plasm amorphize the silicon surface of side and bottom walls 23 in lower portion 28 to form an amorphous silicon layer 34. The thickness of amorphous silicon layer 34 is determined by the energy and dosage of ions implanted into the substrate during the PIII process. Unlike a deposited amorphous silicon layer, amorphous silicon layer 34 does not significantly, if at all, reduce the width of trench 22. Such a reduction, which can reduce the surface area of the electrodes and dielectric of the capacitor being formed, is not desirable. Here, the PIII process can be optimized for amorphous layer 34 to have a thickness in the order of about 2–10 nm, although thicker or thinner amorphous silicon layers may also be formed.

At least three types of species can be used during the PIII process. The first species is silicon. Using silicon to amorphize side and bottom walls 23 of lower portion 28 provides the advantage of introducing no other material into trench 22 so as to preserve electrical characteristics of side and bottom walls 23. The second type of species includes non-dopant and benign species other than silicon, such as argon (Ar) or Xenon (Xe). These species are preferably used at low voltage, for example at 0.5–5 KeV, to preserve the integrity of LOCOS collar 32. The third type of species are reactive dopant species such as phosphorous (P) or arsenic (As). Apart from forming amorphous silicon layer 24, these species also dope a portion of silicon substrate 10 surrounding side and bottom walls 23 of lower portion 28 at the same time as forming amorphized silicon layer 34. As will be described below in reference to FIG. 2G, this doped portion of silicon substrate 10 will form a first electrode of the trench capacitor being formed. This step also implants dopants into amorphous silicon layer 34. By amorphizing and doping the portion of substrate 10 surrounding bottom and side walls 23 of trench 22 in the same implantation step, an ion implantation step for implanting dopant molecules into that portion of substrate 10 and into hemispherical silicon grains (HSG) 33 yet to be formed (shown in FIG. 2F) is eliminated.

Figure 2F:
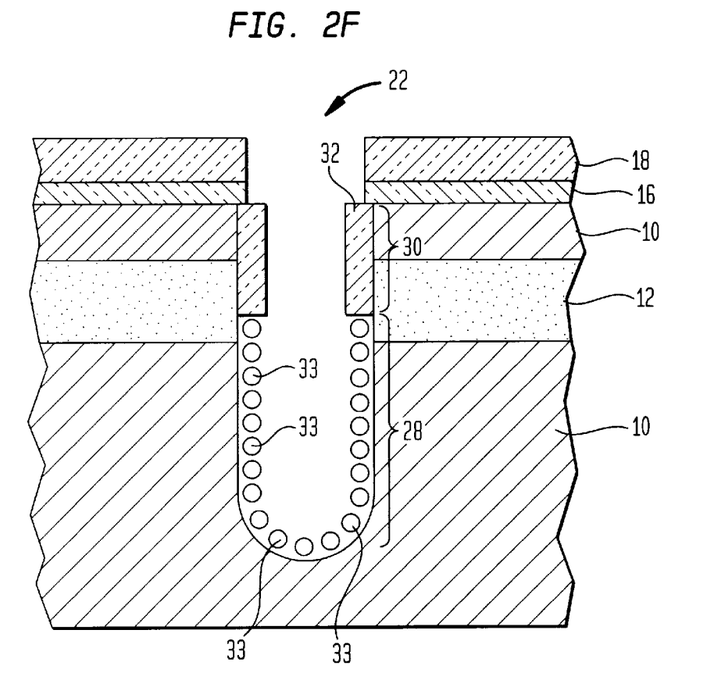

Referring to FIG. 2F, silicon substrate 10 is next placed in chamber or furnace for a two step anneal process to form hemispherical silicon grains (HSG) 33. In the first anneal step, substrate 10 is heated for about 10–40 minutes at about 550–600° C. in a silane (SiH$_4$) gas environment of about $10^{-4}$–$10^{-5}$ Torr. This anneal step causes small crystal structures to be formed on the amorphous silicon layer 34.

In the second anneal step substrate 10 is heated at about 500–600° C. for about 1–10 minutes in an ultrahigh vacuum chamber, or in an inert oxygen free ambient, such as argon, helium, and nitrogen at about $10^{-6}$–$10^{-9}$ Torr. The second anneal step causes silicon from the amorphous silicon layer 34 to migrate to the small crystal structures formed during the first anneal step to form hemispherical silicon grains (HSG) 33 in lower portion 28 of trench 22. The second anneal step is continued until the entire amorphous silicon layer 34 is re-crystallized. At the completion of the second anneal step, the surface area of lower portion 28 of trench 22 is increased, for example, by a factor of 2 to 3.

Figure 2G:
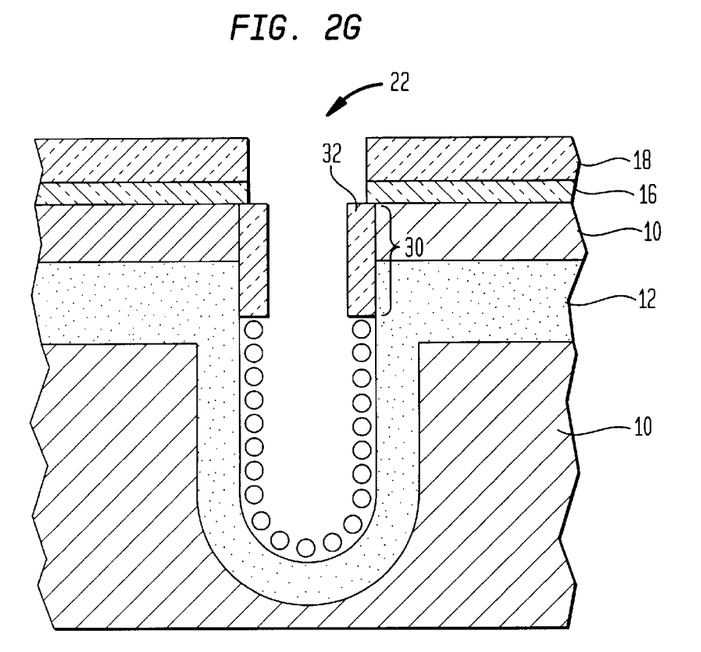

Referring to FIG. 2G, a dopant species, here, arsenic or phosphorous, is next implanted into side and bottom walls of trench 22 and hemispherical silicon grains (HSG) 33, using conventional techniques such PIII or PLAD. If a dopant species is used during the ion implantation process for forming amorphous silicon layer 34 (described in reference to FIG. 2E), this implantation step is not required.

In embodiments in which buried plate 12 is formed at later stage in process, buried plate 12 can be formed at this point by conventional gas phase doping techniques. The entire structure is then placed in an annealing chamber to activate and defuse the implanted dopant species out into portions of substrate 10 surrounding lower portion 28 of trench 22 to form a doped region 36 which acts as one electrode, or plate, of the trench capacitor. The doping step and anneal step for diffusing the dopant species may be performed, in situ, after the two-step anneal process for forming hemispherical silicon grains (HSG). They can also be performed in a separate tool.

Figure 2H:
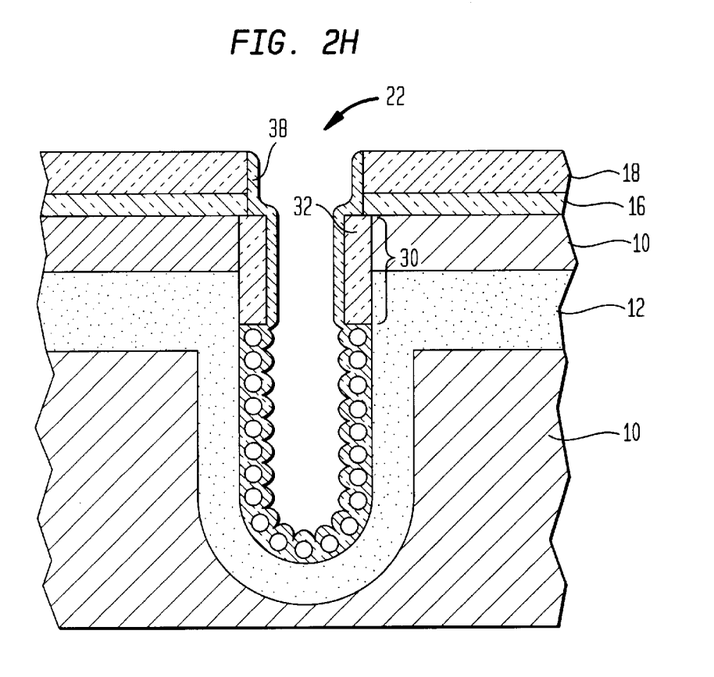

Referring to FIG. 2H, a capacitor dielectric 38 is next formed on walls of trench 22. Here, to so do, substrate is placed in a chamber at a temperature of about 300° C. to 1000° C. for 30 minutes with ammonia ($NH_3$) at 6 Torr. Substrate 10 is then subjected to a low pressure chemical vapor deposition (LPCVD) at 700° C. in $SiH_2Cl_2$ (DCS) and $NH_3$ to form nitride over the walls of trench 22. Substrate 10 is next heated at a temperature of 900° C. for 10 minutes at a pressure of 760 Torr in $H_2O$ to reoxidize the nitride and thermally grow capacitor dielectric 38 (i.e., re-oxidation of the nitrite).

It is noted that capacitor dielectric 38 has an irregular surface in lower portion 28 of trench 22 conforming to the hemispherical silicon grains (HSG) in lower portion 28. Thus, the surface area on the outer surface of capacitor dielectric layer 38 is greater than that which would have resulted from merely forming capacitor dielectric 38 on bottom and side walls 23 of trench 22 in FIG. 2B.

Figure 2I:
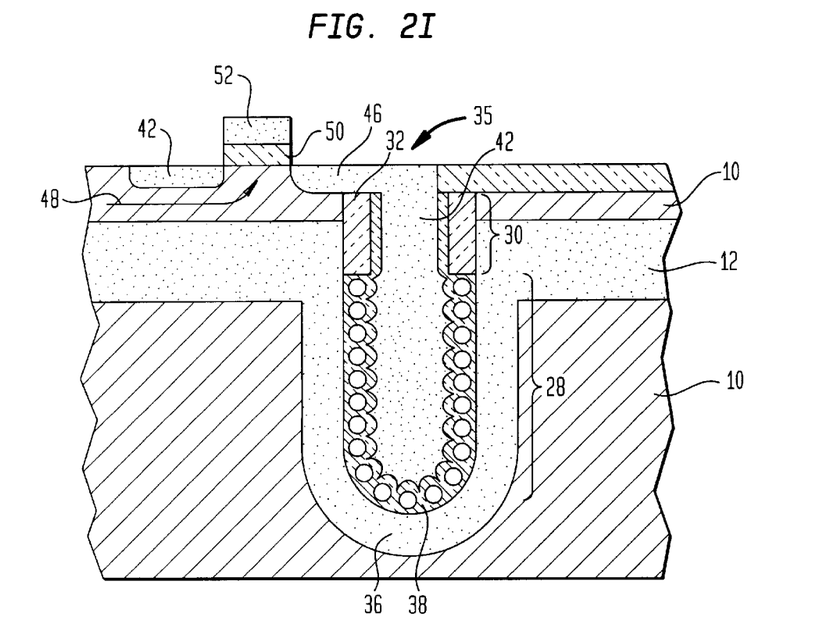

Referring to FIG. 2I, trench 22 is then filled with doped amorphous or doped poly-crystalline silicon 42 to form the second electrode of capacitor 35. It should be noted that poly-crystalline silicon or amorphous silicon deposition may be performed in situ. It is also noted that the surface of poly-crystalline silicon 42 in lower portion 28 of trench 22 conforms to the shape of capacitor dielectric 38. Hence, the surface area of the second electrode of capacitor 35 is increased over surface area of a second electrode which would have resulted from forming the second electrode over a smooth dielectric surface.

The structure is then processed in any conventional manner to form a DRAM cell 40, such as shown in FIG. 2I. DRAM cell 40 includes a transistor 42 having source and drain regions 44, 46 separated by a gate channel region 48. Gate channel region 48 has disposed above it a gate oxide 50 and a doped poly-crystalline silicon, or poly-crystalline silicon tungsten silicide, gate electrode 52. Drain region 46 is electrically connected to the second electrode of capacitor 35.

Other embodiments are within the scope of the following claims.

For example, referring now to FIGS. 3A–3E, a process for forming a stack capacitor DRAM cell 80 will now be described. Stack capacitor DRAM cell 80 a transistor 82 formed in any conventional manner. Transistor 82 has a doped poly-crystalline silicon layer 84 on a thermally grown oxide layer 88 and a conductor 86 on doped poly-crystalline silicon layer 86 to provide a gate electrode for transistor 82. Transistor 82 also has source and drain regions 90 and 92. After completing the formation of transistor 82, the device is passivated with a dielectric layer 94, in any conventional manner, as shown. Next, a lower conductor, here a doped poly-crystalline silicon layer 96, for a stack capacitor 81 (shown in FIG. 3E) is formed in contact with drain region 92.

Figure 3A:
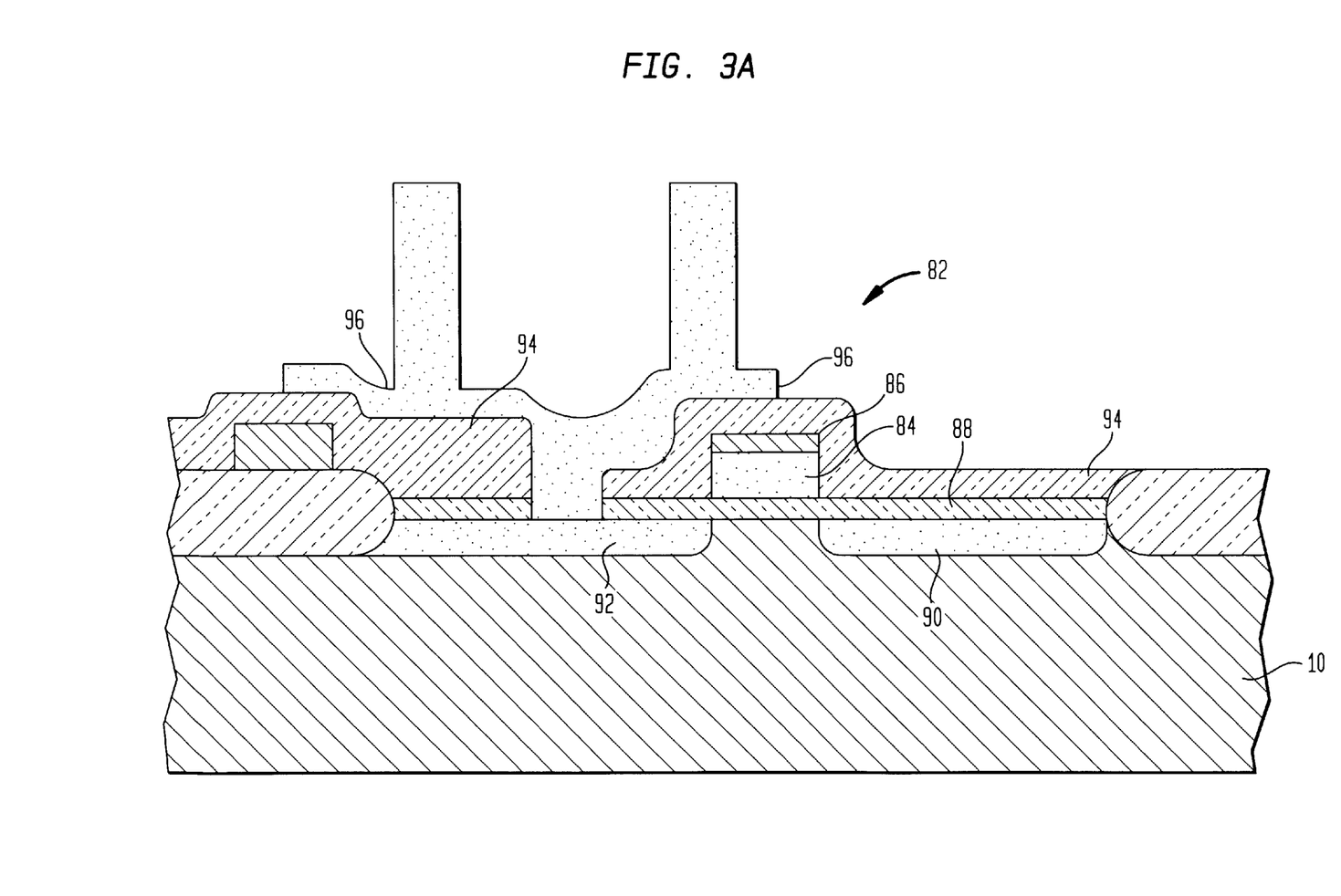
FIGS. 3A–3E are cross-sectional diagrammatical sketches of a stack capacitor DRAM cell at various stages in the fabrication thereof.
Figure 3B:
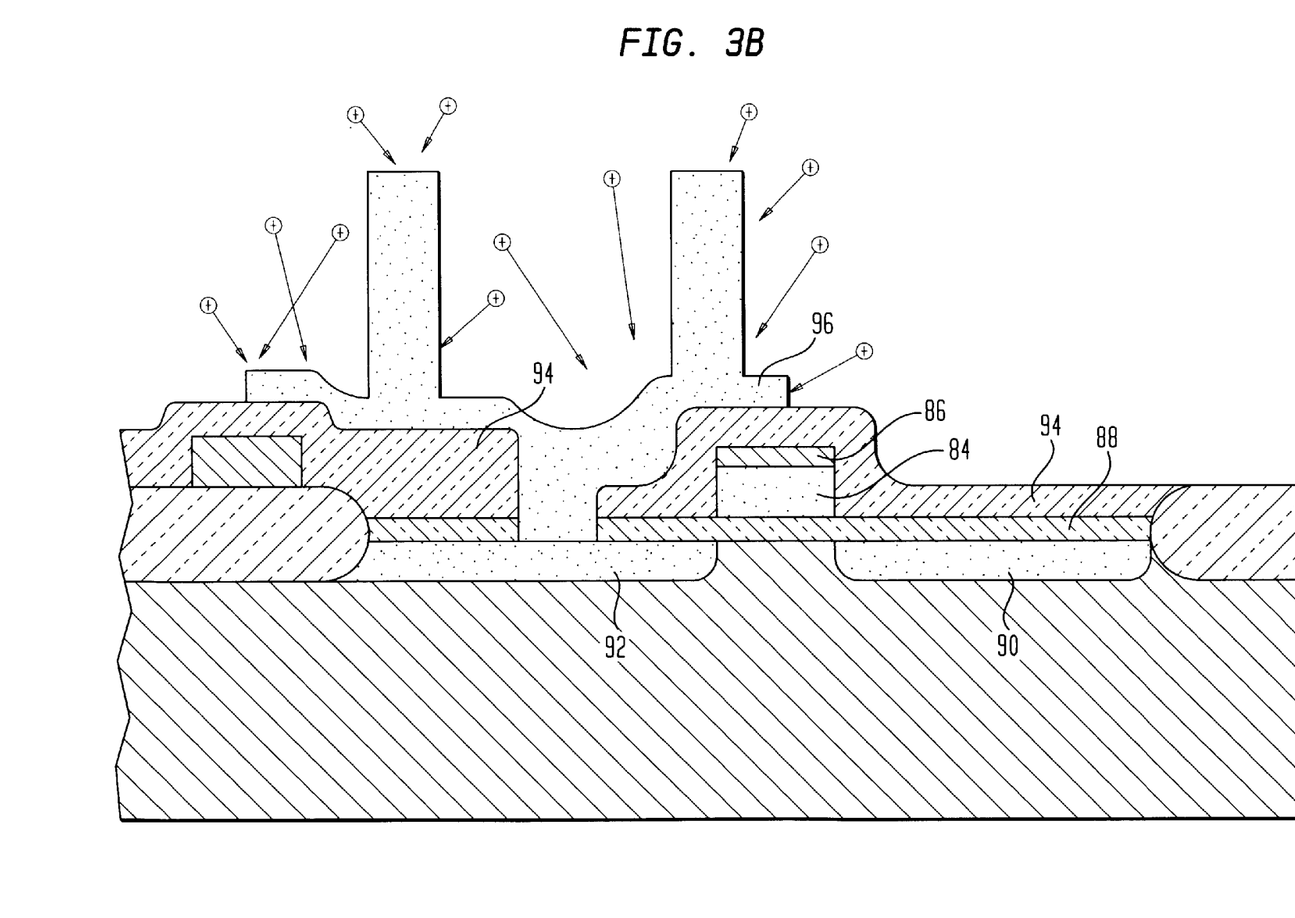

Referring to FIG. 3B, the structure is then subjected to a ion implantation process to amorphize a portion of the surface of poly-crystalline silicon layer 96. Here, the ion implantation process is a PIII or PLAD process.

Figure 3C:
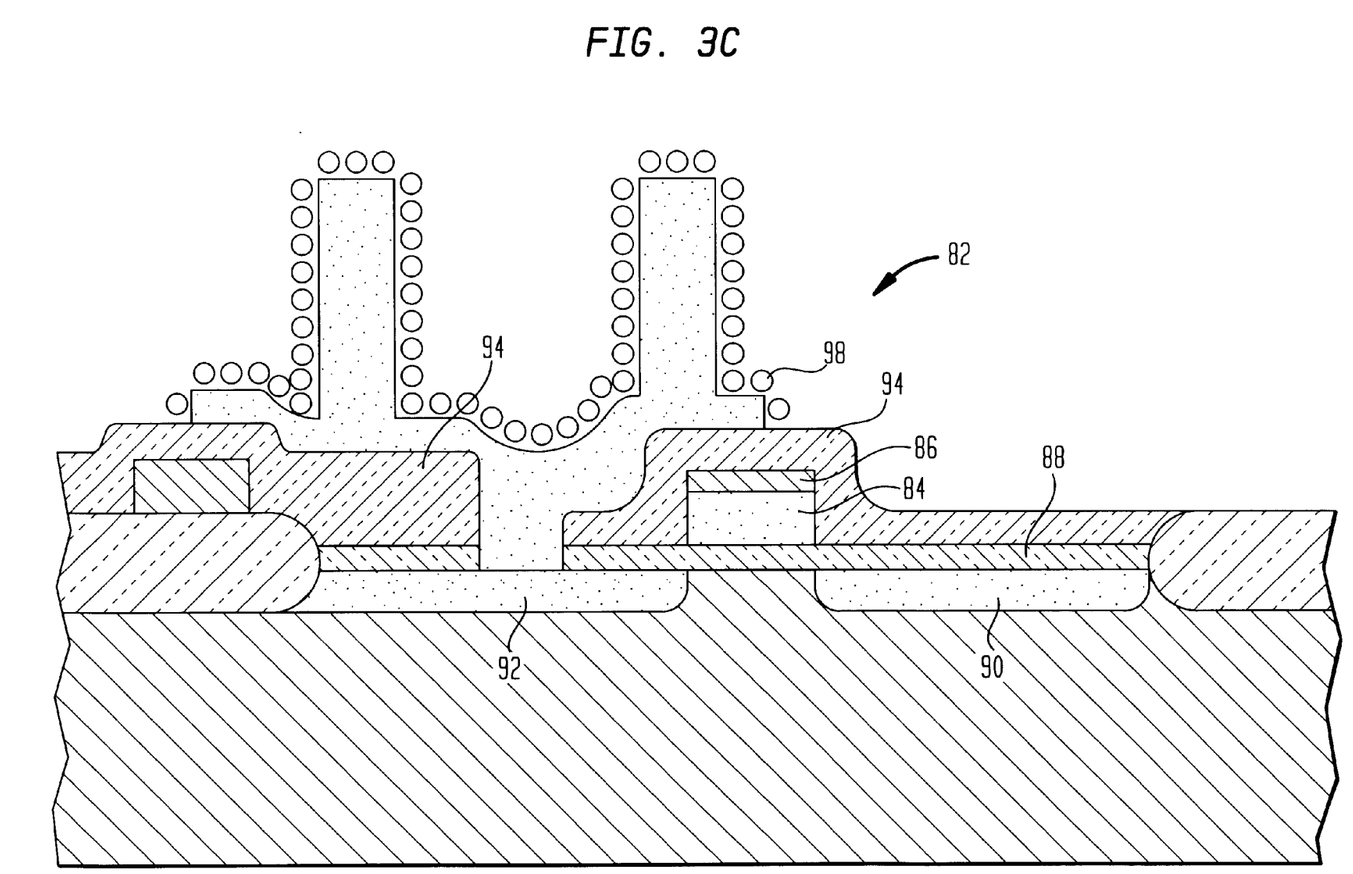

Referring to FIG. 3C, the structure is then placed in an annealing chamber to be subjected to the two-step anneal process described above in connection with FIG. 2F to form hemispherical silicon grains (HSG) 98 on the surface of poly-crystalline silicon layer 96.

Figure 3D:
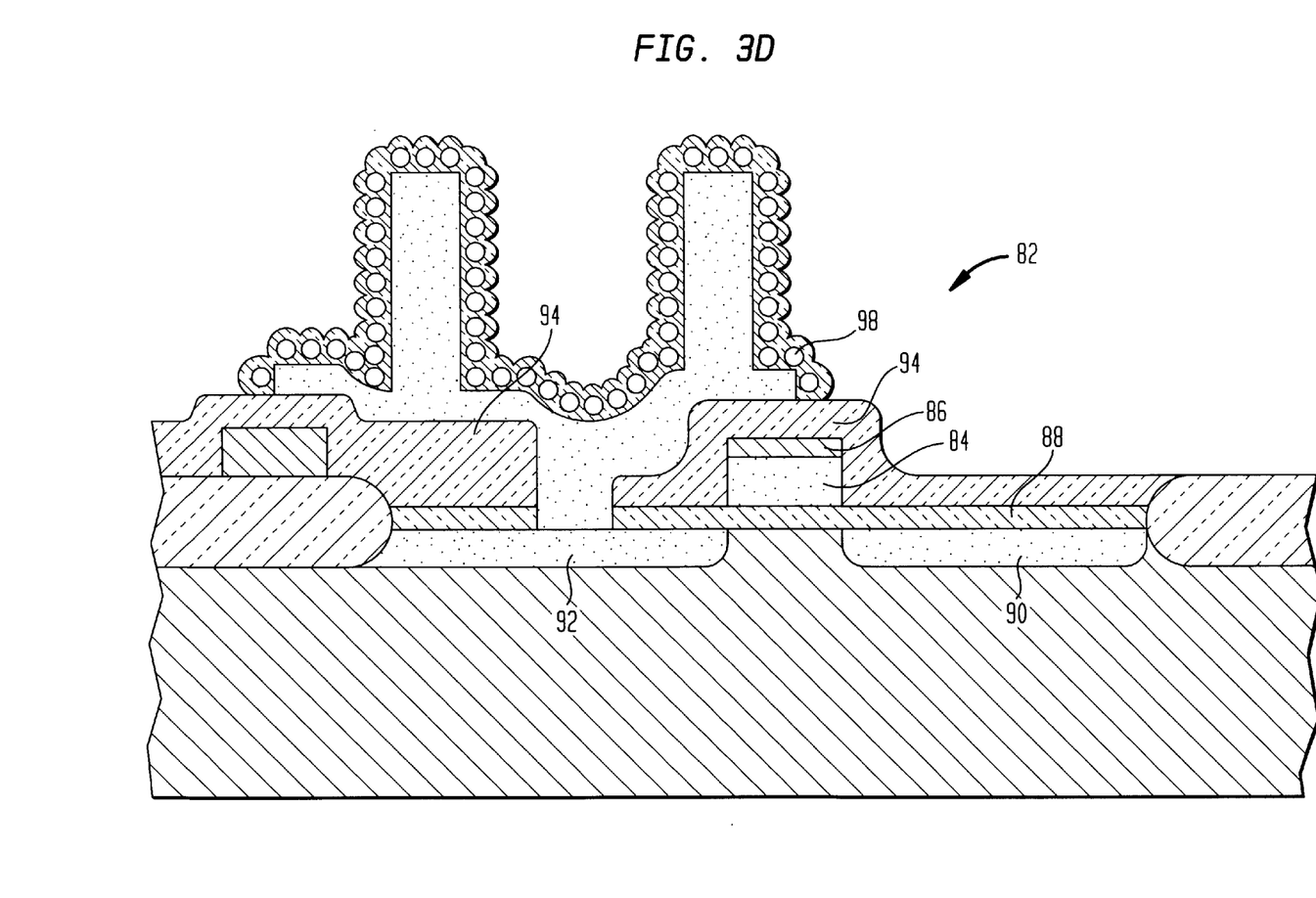

Referring to FIG. 3D, a capacitor dielectric layer 100 is next deposited over hemispherical silicon grains (HSG) 98.

Figure 3E:
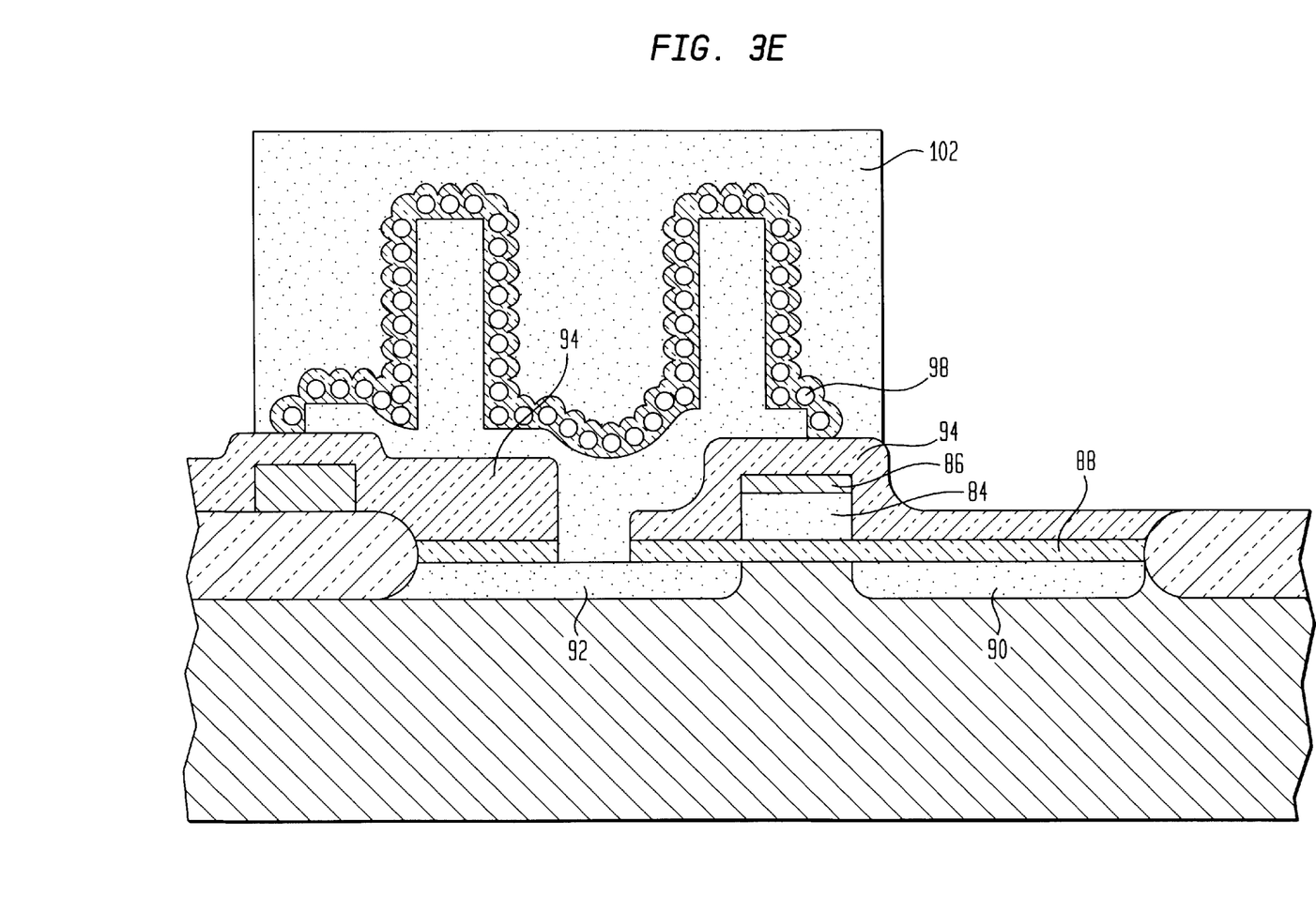

Referring to FIG. 3E, a conductor layer 102, forming a second electrode of the capacitor, is next formed over dielectric layer 100. The surface area of conductors 96 and 102, and capacitor dielectric 100 of capacitor 81 are increased by forming hemispherical silicon grains (HSG) 96.

It is to be understood that while the invention has been described in conjunction with the detailed description thereof, the foregoing description is intended to illustrate and not limit the scope of the invention, which is defined by the scope of the appended claims. Other aspects, advantages, and embodiments are within the scope of the following claims.

What is claimed is:

1. A method of manufacturing a capacitor comprising:
   providing a silicon surface,
   amorphizing at least a portion of the silicon surface,
   forming a trench in the substrate, the trench being defined by at least one wall, wherein said at least one wall has a lower portion and an upper portion, the lower portion comprising the silicon surface;
   depositing a mask on the lower portion of said at least one wall;
   forming an insulation collar on the upper portion of said at least one wall;
   subjecting the amorphized silicon surface to an annealing process to form hemispherical silicon grains from the amorphized portion of the silicon surface to form at least a portion of a first electrode of the capacitor,
   forming a capacitor dielectric over the hemispherical silicon grains, and
   forming a second electrode over the capacitor dielectric.

2. The method of claim 1 further comprising
   removing the mask to expose the lower portion of the trench,
   amorphizing the lower portion of said at least one wall.

3. The method of claim 1 wherein amorphizing said silicon surface comprises subjecting the silicon surface to an ion implantation process.

4. The method of claim 3 wherein subjecting the silicon surface to an ion implantation process includes subjecting the silicon surface to a conformal ion implantation process.

5. The method of claim 4 subjecting the silicon surface to an ion implantation process includes subjecting the silicon surface to a plasma immersion ion implantation (PIII) process.

6. The method of claim 4 subjecting the silicon surface to an ion implantation process includes subjecting the silicon surface to a plasma doping (PLAD) process.

7. The method of claim 3 wherein ions used in the ion implantation process substantially comprise silicon ions.

8. The method of claim 3 wherein ions used in the ion implantation process substantially ions of an inert element.

9. The method of claim 8 wherein the inert element is Xenon (Xe).

10. The method of claim 8 wherein the inert element is Argon (Ar).

11. The method of claim 3 wherein ions used in the ion implantation process substantially comprise ions of a dopant species.

12. The method of claim 10 wherein the dopant species is Arsenic (As).

13. The method of claim 8 wherein the dopant species is Phosphorous (P).

14. The method of claim 11 further comprising heating the silicon surface to diffuse the dopant.

15. The method of claim 14 wherein the steps of annealing and heating are performed in situ.

16. The method of claim 1 further comprising implanting, through the hemispherical silicon grains, a dopant species into portions of the silicon substrate surrounding the lower portion of the trench.

17. The method of claim 16 further comprising heating the dopant to diffuse the dopant into the substrate to form another portion of the first electrode.

18. The method of claim 17 wherein the steps of annealing and heating are performed in situ or within the same chamber.

19. The method of claim 1 wherein annealing the silicon surface comprises annealing the silicon surface in silane ($SiH_4$).

20. A method of manufacturing a capacitor on a silicon substrate comprising:

provide a silicon substrate;

forming a trench in the silicon substrate, the trench having a lower portion and an upper portion;

forming a hard mask over the lower portion of the trench;

forming an insulation layer in the upper portion of the trench;

removing the hard mask and exposing a silicon surface of the lower portion of the trench;

subjecting the silicon surface of the lower portion of the trench to a plasma ion immersion process to amorphize the silicon surface, the plasma comprising silicon molecules;

implanting dopant molecules in a portion of the substrate surrounding the lower portion of the trench;

subjecting the substrate to a low temperature, silane bath annealing process to form hemispherical silicon grains from the amorphized portion of the silicon surface, and to diffuse said dopant molecules into the substrate to form a first electrode of the capacitor;

forming a capacitor dielectric over the hemispherical silicon grains; and forming a second electrode over the capacitor dielectric by filling the trench with poly-crystalline silicon.

21. A method of manufacturing a capacitor on a silicon substrate comprising:

providing a silicon substrate;

forming a trench in the silicon substrate, the trench having a lower portion and an upper portion;

forming a hard mask over the lower portion of the trench;

forming an insulation layer in the upper portion of the trench;

removing the hard mask and exposing a silicon surface of the lower portion of the trench;

subjecting the silicon surface of the lower portion of the trench to a plasma ion immersion process to amorphize the silicon surface, the plasma comprising dopant molecules implanted in a portion of the substrate surrounding the lower portion of the trench;

subjecting the substrate a low temperature, silane bath annealing process to form hemispherical silicon grains from the amorphized portion of the silicon surface, and to diffuse said dopant molecules into the substrate to form a first electrode of the capacitor;

forming a capacitor dielectric over the hemispherical silicon grains; and forming a second electrode over the capacitor dielectric by filling the trench with poly-crystalline silicon.

* * * * *